United States Patent [19]
Hagiwara

[11] Patent Number: 5,287,010
[45] Date of Patent: Feb. 15, 1994

[54] DEVICE FOR PREVENTING ERRONEOUS OPERATION WHEN THE CLOCK IS INTERRUPTED IN A CONTROLLER

[75] Inventor: Masao Hagiwara, c/o Kabushiki Kaisha Komatsu Seisakusho Research Institution, 1200, Manda, Hiratsuka-shi, Kanagawa 254, Japan

[73] Assignee: Masao Hagiwara, Japan

[21] Appl. No.: 860,498

[22] PCT Filed: Dec. 27, 1990

[86] PCT No.: PCT/JP90/01722
§ 371 Date: Jun. 11, 1992
§ 102(e) Date: Jun. 11, 1992

[87] PCT Pub. No.: WO91/10176
PCT Pub. Date: Jul. 11, 1991

[30] Foreign Application Priority Data
Dec. 27, 1989 [JP] Japan .................. 1-343484
Jan. 31, 1990 [JP] Japan .................. 2-20966

[51] Int. Cl.[5] .......................... H03K 5/13; H03L 7/00
[52] U.S. Cl. ............................... 307/269; 307/219; 307/272.3; 307/517; 328/111
[58] Field of Search ............... 307/234, 269, 272.3, 307/273, 219, 517, 525, 528; 328/111

[56] References Cited
U.S. PATENT DOCUMENTS

| | | | |
|---|---|---|---|
| 3,634,869 | 1/1972 | Hsuch | 307/234 |
| 3,772,534 | 11/1973 | Dellecave et al. | 307/234 |
| 3,997,798 | 12/1976 | Breimesser | 307/234 |
| 4,329,652 | 5/1982 | Higa et al. | 328/72 |
| 4,600,944 | 7/1986 | Williams | 358/154 |
| 4,633,097 | 12/1986 | DeWitt | 307/269 |
| 4,763,025 | 8/1988 | Takeuchi | 307/526 |

FOREIGN PATENT DOCUMENTS

| | | |
|---|---|---|
| 54-7080 | 1/1979 | Japan . |
| 54-128644 | 10/1979 | Japan . |
| 58-139227 | 8/1983 | Japan . |
| 60-83101 | 5/1985 | Japan . |
| 61-18478 | 5/1986 | Japan . |
| 62-24292 | 2/1987 | Japan . |
| 62-49428 | 3/1987 | Japan . |
| 62-105077 | 5/1987 | Japan . |
| 63-30901 | 2/1988 | Japan . |
| 63-175913 | 7/1988 | Japan . |
| 63-237101 | 10/1988 | Japan . |
| 1-191215 | 8/1989 | Japan . |

Primary Examiner—William L. Sikes
Assistant Examiner—Terry D. Cunningham
Attorney, Agent, or Firm—Welsh & Katz, Ltd.

[57] ABSTRACT

A device is provided to prevent erroneous operation of an object to be controlled connected to the controller if the clock is interrupted. When a clock monitoring unit (15) detects that no clock pulse signal (CL) is generated from a clock generating unit (14) in a controller (10), a D flip-flop (13) is forcibly turned off, so that no drive signal is given to the actuator that is the object to be controlled. Moreover, a clock monitoring unit (42) in a controller (40) detects whether a clock pulse signal (CK1) is being sent from a controller of the preceding stage or not. When the clock pulse signal (CK1) is being received, the clock monitoring unit (42) sends the clock pulse signal (CK1) to the actuator that is the object to be controlled via a data processing unit (44). When the clock pulse signal (CK1) is not detected, a clock pulse signal (CK2) of a self clock generating unit (41) is sent to the actuator that is the object to be controlled via the data processing unit (44).

2 Claims, 5 Drawing Sheets

DEVICE FOR PREVENTING ERRONEOUS OPERATION WHEN THE CLOCK IS INTERRUPTED IN A CONTROLLER

TECHNICAL FIELD

The present invention relates to a device for preventing erroneous operation of a controller using a clock for its internal control when the clock is interrupted.

BACKGROUND ART

Figure 9:
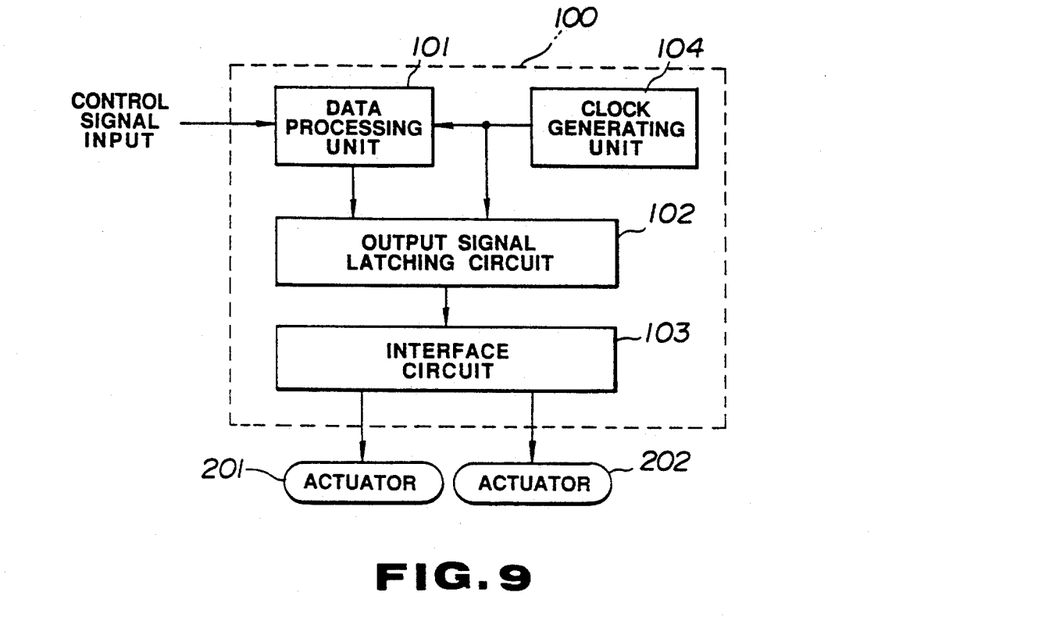
FIG. 9 is a block diagram of a conceptional arrangement of an actuator controller for explaining a prior art.

FIG. 9 shows a concept of an arrangement of a controller which performs its internal control based on a clock pulse as a reference generated at intervals of a constant time to controllably drive actuators.

As shown in the drawing, when a control signal including control data for driving of actuators 201 and 202 is applied to a controller 100, a data processing unit 101 in the controller extracts the control data from the received control signal and outputs it to an output signal latching circuit 102. During this operation, the data processing unit 101 is operated in synchronism with a clock pulse signal received from a clock generating unit 104. The latching circuit 102 latches the received control data and outputs the latched control data to an interface circuit 103. During this operation, the latching circuit 103 is similarly operated in synchronism with the clock pulse signal received from the clock generating unit 104. The interface circuit 103 subjects the input signal to a predetermined Level conversion and outputs the converted control data to the actuators 201 and 202 to controllably drive these actuators 201 and 202. Assume that the latching circuit 102 is made up of such a sequential circuit as, for example, a D flip-flop.

However, there sometimes occurs that the output of the clock pulse from the clock generating unit 104 is interrupted. This causes the subsequent clock pulse signal to remain at its logical level "0". Accordingly, when the output of the latching circuit 102 (D flip-flop) prior to the interruption of the output of the clock pulse remains at its logical level "1", the logical level "1" is maintained even after the stoppage of the output of the clock pulse. This results in that the interior of the controller is riot normally operated so that the actuators 201 and 202 become uncontrollable.

Therefore, the safety of the system will be remarkably deteriorated.

Figure 10:
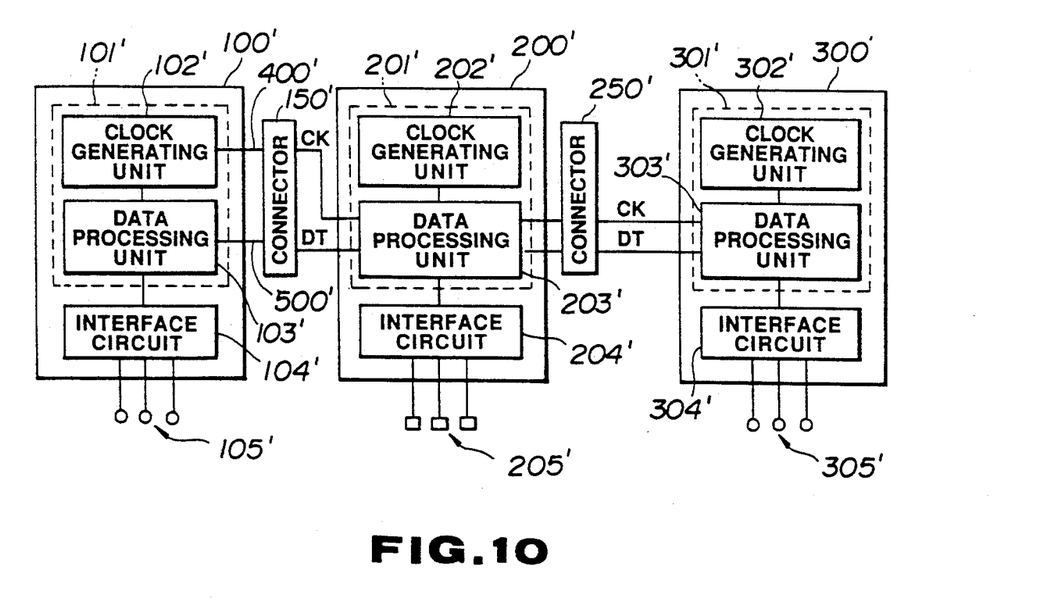
FIG. 10 is a block diagram of a conceptional arrangement of a serial control system for explaining the prior art.

Also shown in FIG. 10 is a concept of an arrangement of a serial control system in which nodes (which will be referred to as the controllers, hereinafter), which respectively perform their internal controlling operation based on a clock pulse generated at intervals of a constant time to detect sensor signals and/or controllably drive associated actuators, are connected in a daisy chain form.

A data processing unit 103' in a controller 100' shown in the drawing generates control data for control of driving operation of a group of actuators 105' and outputs it to an interface circuit 104'. During this time, the data processing unit 103' is operated in synchronism with a clock pulse signal received from a clock generating unit 102'. The interface circuit 104' subjects the input signal to a predetermined level conversion, and outputs the converted control data to the group of actuators 105' to controllably drive these actuators 105'. And a clock pulse signal CK issued from the clock generating unit 102' as well as a data signal DT subjected at the data processing unit 103' to the data processing operation are transmitted through respective signal lines 400' and 500' to respective data processing units 203' and 303' of controllers 200' and 300' of the next and subsequent stages. In this case, the data processing unit 203' of the controller 200' receives the aforementioned clock pulse signal CK and data signal DT to operate in synchronism with the received clock pulse signal CK. That is, the data processing unit adds the received data signal DT to detection data from a group of sensors 205' through an interface circuit 204'. On the other hand, the data processing unit 303' of the controller 300' similarly receives the clock pulse signal CK and the data signal DT transmitted through the controller 200' to operate in synchronism with the received clock pulse signal CK, so that the data processing unit 303' controllably drives a group of actuators 305' through an interface circuit 304' on the basis of the received data signal DT, as in the above data processing unit 103'.

In the respective controllers 100', 200' and 300', the data processing units 103', 203' and 303' and the clock generating units 102', 202' and 302' are made as signal processing units 101', 201' and 301' respectively in the form of a single package of gate array (a sort of integrated circuit (IC) known as ASIC designed for specific applications). In this way, in spite of the fact that the controllers 200' and 300' contain their own clock generating units 203' and 303', the controllers use not output clocks of their clock generating units 203' and 303' but the output clock of the clock generating unit 103' of the controller 100'. This is because, when the clock pulse signal CK and the data signal DT are separately transmitted through the signal lines 400' and 500' to the next and subsequent stages of the controllers 200' and 300', hit synchronization can be completely achieved and thus reliable communication can be realized.

The signal lines 400' and 500' are connected to connectors 150' and 250' respectively between the controllers 100' and 200' and between the controllers 200' and 300'.

For this reason, in the case where such a serial control system is mounted within the interior of a machine such as a car or a press machine tool, which generates a strong vibration, there may take place that the vibration causes the aforementioned connectors 150' and 250' to be disconnected, resulting in a broken line between the controllers. This leads to the fact that the controllers 200' and 300' located downstream of the broken line fail to receive the clock pulse signal CK that is to be sent from the controller 100', whereby the interiors of the controllers 200' and 300' are not normally operated so that the data detection of objects to be controlled by the controllers 200' and 300', i.e., of the sensor group 205' as well as the driving control of the actuator group 305' become disabled. As a result, the system safety is deteriorated to a large extent.

In view of such circumstances, the present invention has been made, and an object thereof is to provide a device which can avoid a control object from being put in its uncontrollable state, even when a clock within a controller is stopped or a broken line between controllers causes the failure of transmission of a clock signal.

DISCLOSURE OF THE INVENTION

In accordance with an aspect of the present invention, there is provided a device for preventing erroneous operation of a controller when a clock in the controller is stopped, in which the controller has clock pulse generating means for generating a clock pulse signal and a sequential circuit for latching input data on the basis of the clock pulse signal of the clock pulse generating means and applying the latched data to a control object; the device comprising clock stoppage detecting means for detecting stoppage of the clock pulse signal, and means for forcibly turning off the sequential circuit in response to a detection output of the clock stoppage detecting means.

That is, with such an arrangement, when the clock stoppage detecting means detect the stoppage of the clock pulse signal, the sequential circuit is forcibly turned off.

In accordance with a further aspect of the present invention, there is provided a device for preventing erroneous operation of a serial control system when a clock in the system is stopped, the system including a plurality of nodes connected in series through a data signal line and a clock signal line; each of said controllers comprising reception stoppage detecting means for detecting stoppage of reception of a clock signal received through the clock signal line, a clock generating circuit for generating a clock signal, change-over means for selecting the clock signal received through the clock signal line when the reception stoppage detecting means fails to detect the stoppage of reception and selecting the clock signal issued from the clock generating circuit, and means for processing data received through the data signal line in synchronism with the clock signal received from the change-over means.

That is, with such an arrangement, each node, while the reception of the clock signal is being detected, processes the input data in synchronism with the clock signal. When the stoppage of the reception of the clock signal is detected, each node, in response to the detection output, processes the input data in synchronism with the clock signal generated at the self clock generating circuit.

Further in the present invention, the clock generating circuit is arranged to extract the clock signal from the data received through the data signal line and generate the extracted clock signal.

That is, since each node extracts the clock signal from the input data signal, the phase of the generated clock signal coincides with that of the input data signal.

Accordingly, when the stoppage of the reception of the clock signal is detected, the input data is processed in response to the detection output in synchronism with the self clock signal made to coincide with the received data signal with respect to the phase.

BEST MODE FOR CARRYING OUT THE INVENTION

The present invention will be detailed with reference to the accompanying drawings.

Explanation will be made as to a first embodiment of the present invention.

Figure 1:
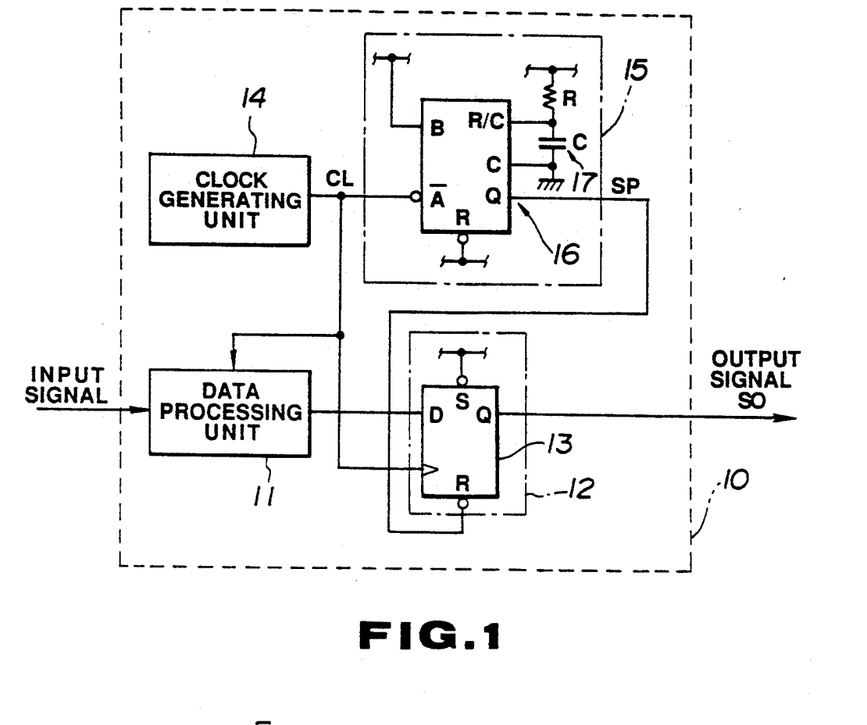
FIG. 1 is a block diagram of a first embodiment of an erroneous-operation prevention device in accordance with the present invention when a clock is stopped in a controller.

FIG. 1 shows a controller for performing driving control over predetermined actuators, which is made on the basis of the controller shown earlier in FIG. 9.

As shown in the drawing, when an input signal containing control data for driving of an actuator (not shown) is applied to a controller 10, a data processing unit 11 in the controller extracts the control data from the received input signal and outputs it to an output signal latching circuit 12. During this time, the data processing unit 11 is operated in synchronism with a clock pulse signal CL received from a clock generating unit 14. Assume now that the output signal latching circuit 12 comprises a D flip-flop 13. An output signal of the data processing unit 11 is applied to one input terminal of the D flip-flop 13. The clock pulse signal CL as the output of the clock generating unit 14 is also applied to the other input terminal of the D flip-flop 13. An output signal SO of the D flip-flop 13 is applied through a not shown interface circuit to predetermined actuators as their driving signal.

A clock monitoring circuit 15, which comprises a retrigger type monostable multivibrator 16 (which will be referred to merely as the multivibrator, hereinafter) as its main constituent element, receives at its input terminal the clock pulse signal CL corresponding to the output of the clock generating unit 14, outputs a clock stop signal SP having a logical level "1" as its metastable state at the time of catching a rising edge in the signal CL, and maintain the output SP of logical level "1" (metastable state) when continuously receiving the signal CL at its input terminal. Further, the flip-flop 16 outputs the clock stop signal SP of logical level "0" as its stable state when failing; to grasp a falling edge in the next clock pulse signal CL to be received at the input terminal even after passage of a time T determined by a resistor R and a capacitor C of a differentiation circuit 17 from the catching of the falling edge in the previous clock pulse signal CL. Such a clock stop signal SP is applied to a reset terminal R of the D flip-flop 13. The illustrated controller is set so that, so long as the output signal SO of logical level "0" is applied from the D flip-flop 13 through the not shown interface circuit 103 to the actuators, the actuators will not be put in their uncontrollable state.

Figure 2:
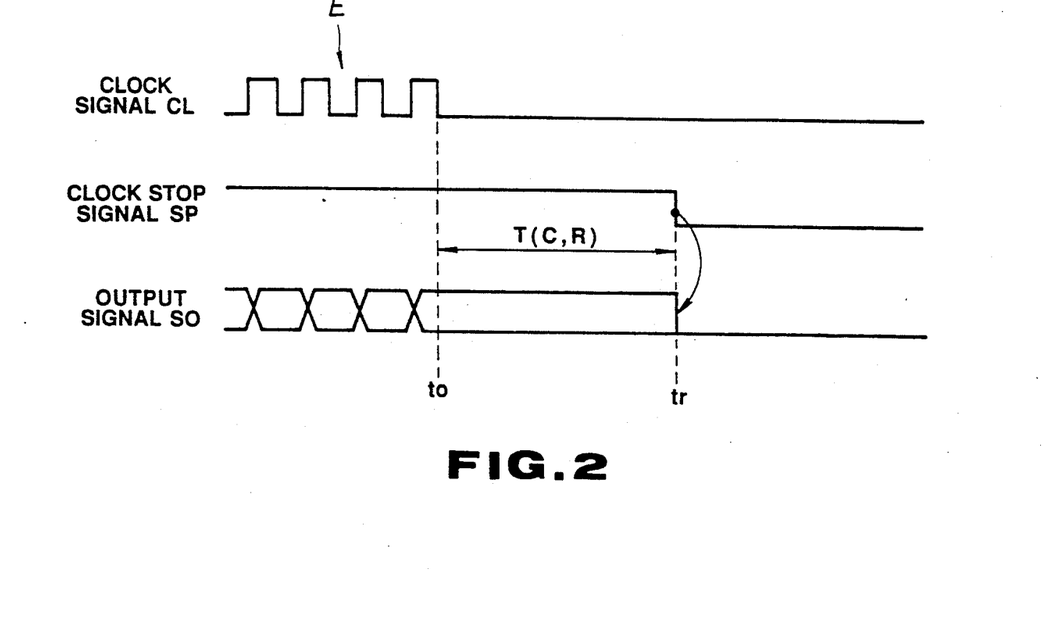
FIG. 2 is a timing chart showing variations in output signals of different parts in the device of FIG. 1.

Now, when such a clock pulse signal CL as shown by an arrow E in FIG. 2 is continuously applied to the input terminal of the multivibrator 16, the clock stop signal SP of logical level "1" is applied to the reset terminal R of the D flip-flop 13, so that the D flip-flop 13 without being reset is outputting the signal SO according to the input signal of the data Processing unit 11 in synchronism with the clock pulse signal CL. At a time to, the clock pulse signal CL falls and then at a time tr, if the multivibrator 16 fails to receive the clock pulse signal at its input terminal then the output clock stop signal SP of the multivibrator 16 is changed from its logical level "1" to "0" and applied to the reset terminal R of the D flip-flop 13. This causes the D flip-flop 13 issues the output signal SO having a logical level "0" maintained after the current time tr regardless of the logical level "1" or "0" of the output signal SO before the time tr.

For this reason, after the time tr, the actuators will not be put in their uncontrollable state. In this connection, when it is desirable that the application of the output signal SO of logical level "1" from the D flip-flop 13 to the actuators causes no uncontrollable state of the actuators, the output clock stop signal SP of the multivibrator 16 is applied to the set terminal of the D flip-flop 13.

Figure 3:
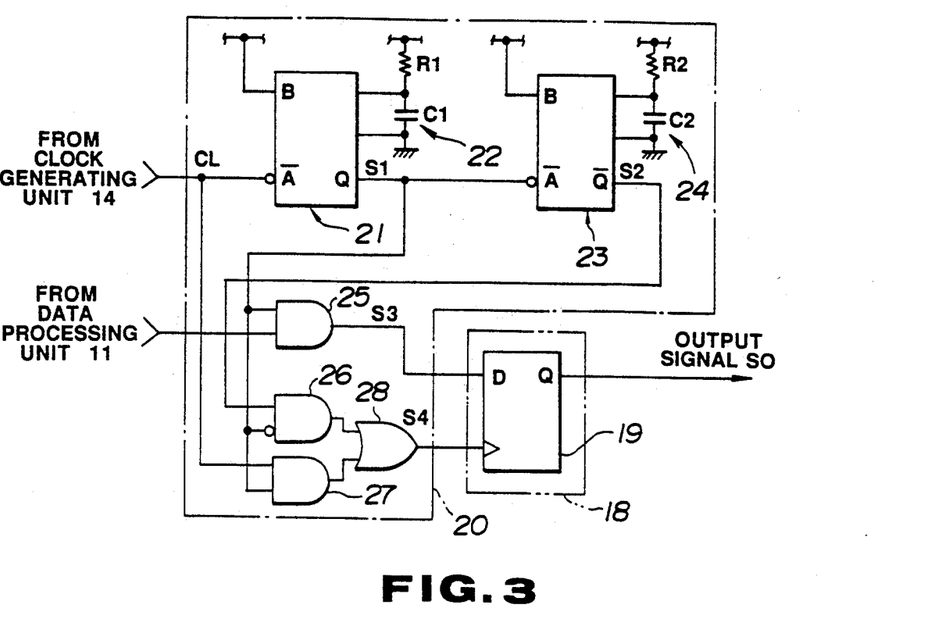
FIG. 3 is a block diagram of a second embodiment of the present invention.

Next shown in FIG. 3 is a second embodiment of the present invention. The drawing shows an exemplary structure in which an output signal latching circuit 18 comprises a flip-flop 19 without a reset terminal and a set terminal.

Figure 4:
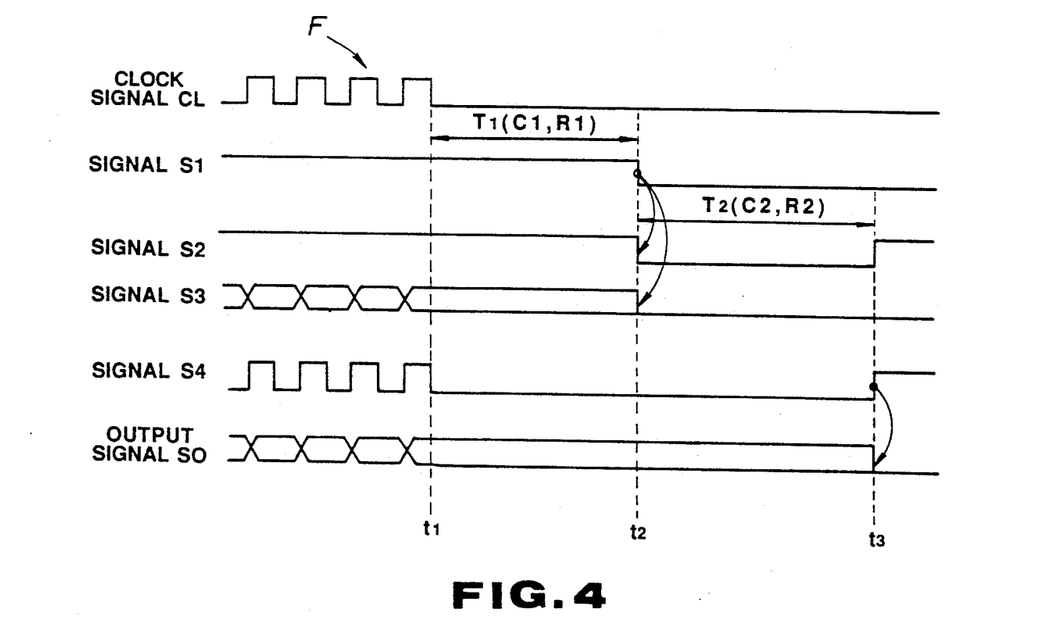
FIG. 4 is a timing chart showing variations in output signals of different parts in the device of FIG. 3.

Explanation will be made by referring to FIG. 3 and also to FIG. 4.

When such a clock pulse signal CL as shown by an arrow F in FIG. 4 continuously generated at the clock generating unit 14 is applied to an input terminal of the retrigger type monostable multivibrator (which will be referred to merely as the multivibrator, hereinafter) 21, the multivibrator 21 outputs a signal S1 having a logical level "1" as its metastable state. When the signal S1 is applied to an input terminal of a retrigger type monostable multivibrator (which will be referred to merely as the multivibrator, hereinafter) 23, the multivibrator outputs a signal S2 having a logical level "1" as its stable state. Accordingly, when an output of the data processing unit 11 and the output S1 of the multivibrator 21 are applied to an AND circuit 25, the circuit 25 outputs a signal S3 having the same logical level as the output of the data processing unit 11. When the output S1 of the multivibrator 21 and the output S2 of the multivibrator 23 are applied to a logical inversion input terminal and an input terminal of an AND circuit 26 respectively, the AND circuit 26 outputs a signal having a logical level "0". When the output S1 of the multivibrator 21 and the output CL of the clock generating unit 14 are applied to input terminals of an AND circuit 23, the AND circuit 27 outputs a signal having the same logical level as the output of the clock generating unit 14. Thus, an OR circuit 28, when receiving the outputs of the AND circuits 26 and 27, outputs a signal S4 having the same logical level as the clock pulse signal CL. The D flip-flop 19, when receiving the signals S3 and S4 at its data terminal D and clock terminal, outputs the signal S0 according to the input signal of the data processing unit 11 in synchronism with the clock pulse signal CL.

After the clock pulse signal CL falls at a time t1, when a time T1 determined by a resistor R1 and a capacitor C1 of a differentiation circuit 22 elapses, that is, when a time is t2, no application of the next clock pulse signal CL to the input terminal of the D flip-flop 19 causes the output signal S1 of the multivibrator 21 to change its logical level from "1" to "0". This falling change causes the output S2 of the flip-flop 23 to be changed from its logical level "1" to "0" and also causes the output S3 of the AND circuit 25 to be changed to its logical level "0" regardless of the previous logical level. After this, at a time t3 after the passage of a time T2 determined by a resistor R2 and a capacitor C2 of a differentiation circuit 24 from the time t2, the flip-flop 23 outputs the signal S2 of logical level "1" as its table state. Thus the output S4 of the OR circuit 28 changes its logical level from "0" to "1" at the time t3. In this case, the input at the data terminal D of the D flip-flop 19 is at its logical level "0" and the input at the clock input terminal changes its logical level from "0" to "1". Thus this rising change causes the output SO of the D flip-flop 19 to have a logical level "0" after the time t3 regardless of the logical level before the time t3.

For this reason, after the time t3, the actuators are prevented from being put in their uncontrollable state.

As has been explained above, in accordance with the second embodiment, after the time point of the passage of the time determined by a time constant of the retrigger type monostable multivibrator 21 from the generation of the previous clock pulse signal CL, the output of the output signal latching circuit is arranged to be changed to such a logical level that the actuators will not be put in their uncontrollable state, whereby the uncontrollable state caused by the stoppage of the clock can be avoided and thus the system safety can be remarkably improved.

Although the clock monitoring circuit is comprised of the retrigger type monostable multivibrator as its main constituent element in the first and second embodiments, the present invention is not limited to the specific example, but any circuit configuration may be employed so long as the circuit configuration can stop the clock pulse signal and in response to the detection, can forcibly turn off the sequential circuit for supplying the drive signal to the actuators.

Explanation will then be made as to a third embodiment of the present invention.

Figure 5:
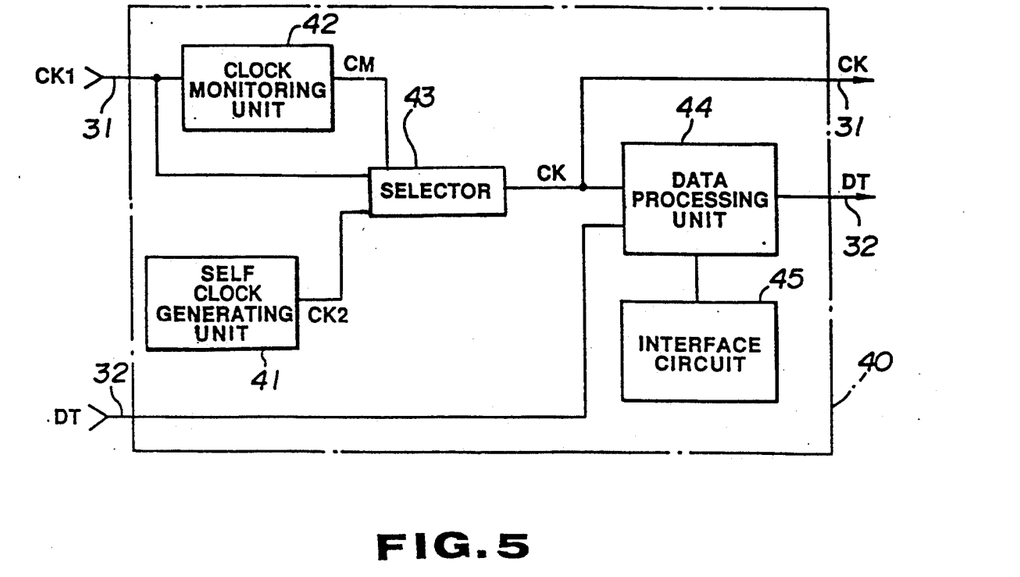
FIG. 5 is a block diagram of a conceptional arrangement of a third embodiment of the present invention.

FIG. 5 shows a controller in accordance with the third embodiment of the present invention. This embodiment shows an arrangement of a controller 40 corresponding to the controller 200' or 300' in the configuration of FIG. 10.

Applied to the controller 40 through a signal line 31 is a clock pulse signal (which will be referred to as the separate-transmission clock pulse signal, hereinafter) CK1 which is generated by a controller at the foremost stage (corresponding to the controller 100'). More specifically, the separate-transmission clock pulse signal CK1 is applied to clock monitoring circuit 42 and also to a selector 43. The controller 40 also receives a data signal DT from a controller at the previous stage and sends the data signal DT to a data processing unit 44. The clock monitoring circuit 42 is used to detect whether or not the separate-transmission clock pulse signal CK1 is being received and to output to the selector 43 a signal (which will be referred to as the clock change-over signal, hereinafter) CM indicative of the reception or stoppage of the signal, CK1. A self clock generating unit 41 generates a clock pulse signal (which will be referred to as the self clock pulse signal, hereinafter) CK2 and sends it to the selector 43.

The selector 43, according to the received clock change-over signal CM, selectively outputs the separate-transmission clock pulse signal CK1 or the self clock pulse signal CK2 to the data processing unit 44. In more detail, when the content of the clock change-over signal CM indicates the reception of the separate-transmission clock pulse signal CK1, the selector 43 outputs the separate-transmission clock pulse signal CK1 to the data processing unit 44; while, when the content of the clock change-over signal CM indicates the stoppage of reception of the separate-transmission clock pulse signal CK1, the selector outputs the self clock pulse signal CK2 to the data processing unit 44. That is, the selector 43 transmits either the separate-transmission clock pulse signal CK1 or self clock pulse signal CK2 to a controller at the next stage through the signal line 31.

The data processing unit 44 is operated under the control of the clock pulse signal CK issued from the selector 43. When the selector 43 outputs the separate-transmission clock pulse signal CK1, since the clock Pulse signal CK1 coincides with the received data signal DT with respect to their phase, that is, since the signals are in synchronism with each other, the data processing unit 44 is operated in synchronism with the separate-transmission clock pulse signal CK1. In other words, in the case where a group of actuators not shown are connected to the controller 40, the data processing unit 44 extracts from the received data signal the control data DT for control of the actuator group, processes it as a drive signal for the actuator (group through an interface circuit 45, and sends it to the actuator group. When the selector 43 outputs the self clock pulse signal CK2, however, the phase of the clock pulse signal CK2 does not necessarily coincide with that of the received data signal DT. Thus, the data processing unit 44 is not necessarily operated in synchronism with the self clock pulse signal CK2. However, since the clock pulse signal is supplied anyway, it can be prevented that the stoppage of the clock results in the failure of internal control of the data processing unit 44, that is, the failure of control of the actuator group as control objects.

Figure 7:
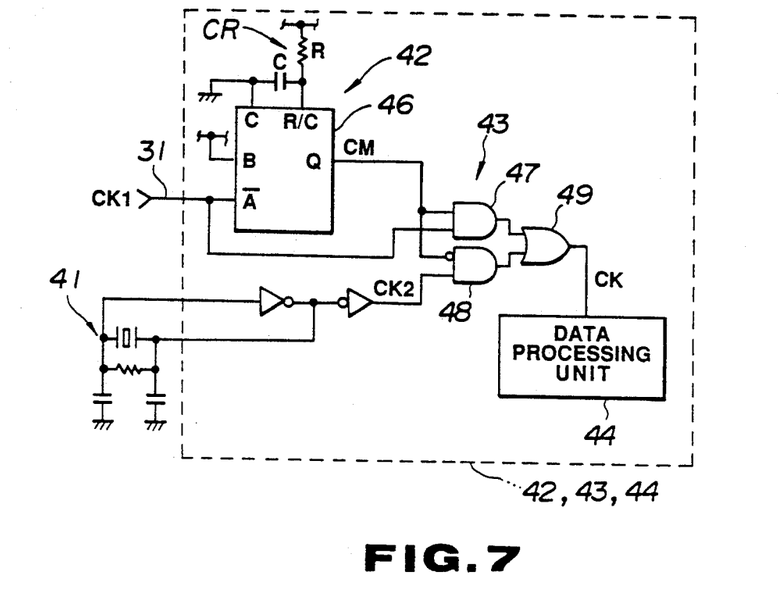
FIG. 7 is a conceptional circuit diagram of an exemplary arrangement of a clock monitoring unit and a selector in FIG. 5 or 6.
Figure 8:
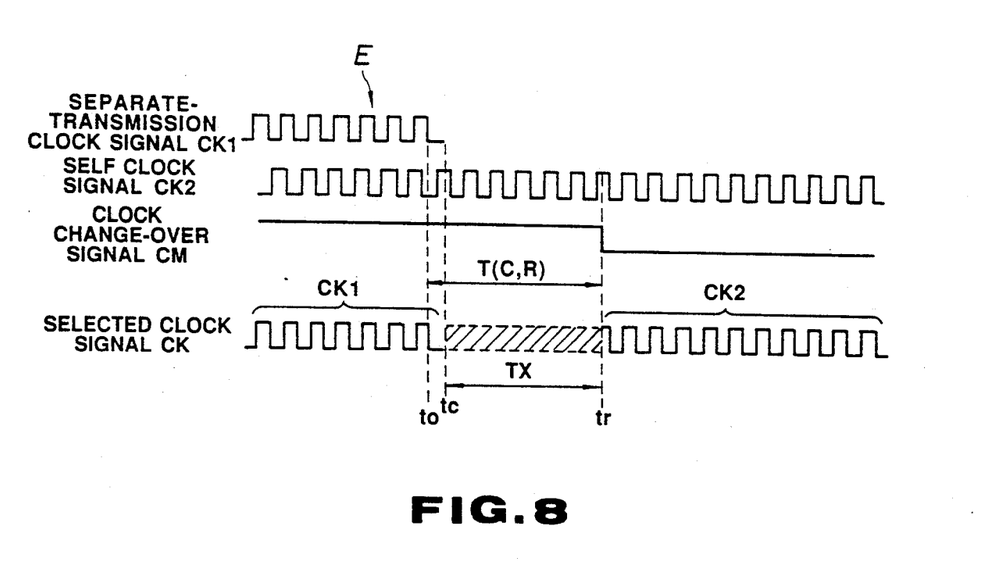
FIG. 8 is a timing chart showing variations in signals appearing in different parts of the circuit of FIG. 7.

Shown in FIG. 7 is, as an example, a circuit configuration of the clock monitoring circuit 42 and selector 43 shown in FIG. 5. FIG. 8 is a timing chart of signals appearing in various parts in FIG. 7. Explanation will be made by referring to these drawings.

The clock monitoring circuit 42 comprises a retrigger type monostable multivibrator (which will be referred to merely as the multivibrator, hereinafter) 46 as its main constituent element. When the signal line 31 is not broken and such a separate-transmission clock pulse signal CK1 as shown by an arrow E in FIG. 8 is being applied to an input terminal of the multivibrator 46 through the signal line 31, the multivibrator 46 can continually catch falling edges in the separate-transmission clock pulse signal CK1. Thus, the multivibrator 46 outputs the clock change-over signal CM having a logical level "1" as its metastable state to one input terminal of an AND circuit 47 and also to a logical inversion input terminal of an AND circuit 48 of the selector 43. Applied to the other input terminal of the AND circuit 47 and the other input terminal of the AND circuit 48 are the separate-transmission clock pulse signal CK1 and the self clock pulse signal CK2 of the self clock generating unit 41 comprising mainly a crystal oscillator respectively. Accordingly, the AND circuit 47 outputs a signal having the same logical level as the separate-transmission clock pulse signal CK1 and applies it to one input terminal of an OR circuit 49, while the AND circuit 48 applies a signal having a logical level "0" to the other input terminal of the OR circuit 49 regardless of the logical level of the self clock pulse signal CK2, which results in that the OR circuit 49 outputs the separate-transmission clock pulse signal CK1 to the data processing unit 44 (refer to FIG. 8). When the selector 43 outputs the separate-transmission clock pulse signal CK1 as the selected clock signal CK to the data processing unit 44 in this way, the data processing unit 44 can carry out the aforementioned processing in synchronism with the separate-transmission clock pulse signal CK1.

If a disconnection of the connector 150' or 250' caused by vibration or the like results in a breaking in the signal line 31 at a time tc, then the multivibrator 46 cannot catch thereafter a falling edge in the separate-transmission clock pulse signal CK1. Therefore, the multivibrator 46 outputs the clock change-over signal CM of logical level "0" as its stable state at a time tr, during which the multivibrator cannot catch a falling edge in the next separate-transmission clock pulse signal CK1 yet, after passage of the time T (determined by the resistor R and the capacitor C in the differentiation circuit CR) from catching of the last falling edge at a time to in the separate-transmission clock pulse signal CK1.

During a time TX of from the generation of the broken line until the clock change-over signal CM changes to its logical level "0", the clock change-over signal CM of logical level "1" is applied to one input terminal of the AND circuit 47 and the separate-transmission clock pulse signal CK1 is not applied to the other input terminal thereof and also is indefinite in its input logical level, which results in that the output logical level of the AND circuit 47 becomes also indefinite and thus the output logical level of the selected clock pulse signal CK issued from the OR circuit 49 becomes also indefinite (refer to a hatched area in FIG. 8).

After the clock change-over signal CM changes to its logical level "0", the AND circuit 47 applies the signal of logical level "0" to one input terminal of the OR circuit 49 regardless of the indefinite logical level of the separate-transmission clock pulse signal CK1 and the AND circuit 48 applies the signal having the same logical level as the self clock pulse signal CK2 to the other input terminal of the OR circuit 49. As a result, after the time tr, the OR circuit 49 outputs the self clock pulse signal CK2 to the data processing unit 44 (refer to FIG. 8).

When the selector 43 outputs to the data processing unit 44 the selected clock pulse signal CK corresponding to the self clock pulse signal CK2 switched from the separate-transmission clock pulse signal CK1 in this way, the data processing unit 44 can be operated based on the self clock pulse signal CK2 to prevent such uncontrollable situations as mentioned above. That is, since the clock is supplied to the data processing unit 44 even after the occurrence of the broken line, such a safety measure as to turn off the output signal to the actuator group can be taken.

Meanwhile, as mentioned above, after the self clock pulse signal CK2 is supplied to the data processing unit 45, no synchronism is established between the self clock pulse signal CK2 and the data signal DT received from the controller at the previous stage so that accurate transfer of sensor detection data and control data cannot be realized between the sensor and actuator groups connected to the controller. The accurate transfer of these data can be realized by making the phase of the self clock pulse signal CK2 to coincide with that of the data signal DT.

Figure 6:
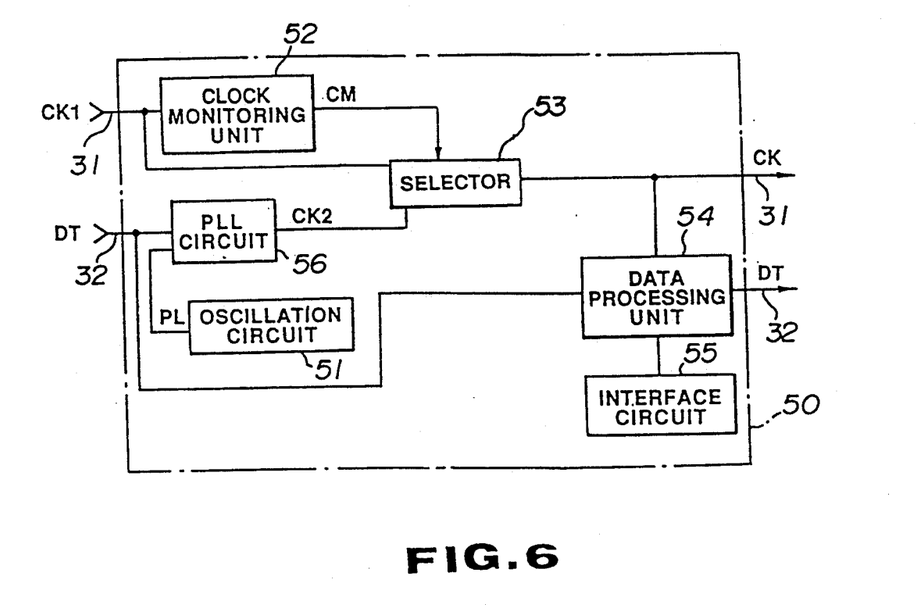
FIG. 6 is a block diagram conceptionally showing an arrangement of a fourth embodiment of the present invention.

Referring to FIG. 6, there is shown an exemplary configuration of the controller which can attain synchronism between the clock pulse signal and data signal even after a broken line.

The controller shown in the drawing comprises an oscillation circuit 51, a clock monitoring circuit 52, a selector 53, a data processing unit 54 and an interface circuit 55, which correspond to the self clock generating unit 41, clock monitoring circuit 42, selector 43, data processing unit 44 and interface circuit 45 in FIG. 5 respectively, and also comprise a phase lock loop (PLL) circuit 56 attached thereto. The PLL circuit 56 is used to make the phase of a clock pulse signal PL generated at the oscillation circuit 51 to coincide with that of the data signal DT received through the signal line 32 and to output the phase-coincidence clock pulse signal PL to the selector 53 as the self clock pulse signal CK2.

For this reason, even after the signal line 31 is broken and the separate-transmission clock pulse signal CK1 is switched to the self clock pulse signal as the selected clock pulse signal CK for the operation of the data processing unit 54 from the time tr on as shown in FIG. 8, accurate transfer of the sensor detection data and control data can be effected between the sensor and actuator groups, as in the case of the separate-transmission clock pulse signal CK1. In the illustrated embodiment, it is assumed that only the signal line 31 is broken.

The controller of FIG. 6 can be suitably used in such applications as factory production lines that, even when a broken line takes place, the line operation cannot be stopped only for repair of the broken line in working hours, that is, continuous line operation is required. In this case, the repair of the broken line may be conducted after the working hours.

Though the clock monitoring circuit 42 or 52 is comprised of the retrigger type monostable multivibrator 46 as shown in FIG. 7 in the third and fourth embodiments, the present invention is not restricted to such a specific example and any circuit configuration may be employed, so long as the circuit configuration can detect the reception of the separate-transmission clock pulse signal CK1 or the stoppage of such reception and can output the detected contents of the selector 43. Further, the selectors 43 and 53 are similarly not limited to the specific example shown in FIG. 7, and any type of sector may be employed so long as it can output the separate-transmission clock pulse signal CK1 to the data processing unit 44 or 54 when receiving the signal indicative of the in-reception state of the separate-transmission clock pulse signal CK1, and in response to the reception stop signal, can switch the separate-transmission clock pulse signal CK1 to the self clock pulse signal CK2 and output the signal CK2 to the data processing unit 44 or 54.

As has been explained in the foregoing, in accordance with the third and fourth embodiments, even when a broken line takes place between nodes, there can be avoided such a situation that control objects become uncontrollable, thus remarkably improving the safety of an application system.

INDUSTRIAL APPLICABILITY

As has been explained in the foregoing, in accordance with the present invention, since the present invention can automatically prevent the erroneous operation of a control object even when such an accident as the stoppage of an internal clock or a broken line between nodes occurs, whereby an application system can be improved in safety to a large extent.

I claim:

1. A device for preventing erroneous operation of a series control system when a clock in the system is stopped, the system including a plurality of controllers connected in series through a data signal line and a clock signal line, a first one of the plurality of controllers including within its interior a clock generation circuit for generating a clock signal, the first one of the controllers generating a data signal synchronized with the clock signal generated by the clock generation circuit, processing data on the basis of the data signal and transmitting the clock signal and the data signal to a subsequent stage controller through the clock signal line and the data signal line, the subsequent stage controller processing data by synchronizing the data signal transmitted from the first one of the controllers through the data signal line with the clock signal transmitted from the first one of the controllers through the clock signal line and transmitting the clock signal and the data signal respectively through the clock signal line and the data signal line to a further subsequent stage controller, each of the subsequent stage controllers comprising:

a clock generation circuit;

reception cessation detecting means for measuring a time taken from reception of the clock signal received from a previous stage controller through the clock signal line until reception of a next clock signal and when the measured time exceeds a predetermined time, for outputting a signal indicative of cessation of the reception;

change-over means for selecting the clock signal received from the previous stage controller through the clock signal line when the signal indicative of cessation of reception is not output from the reception cessation detecting means and selecting the clock signal issued from the clock generating circuit provided within the respective subsequent stage controller when the signal indicative of cessation of reception is output from the reception cessation detecting means; and data processing means for processing the data by synchronizing the data signal transmitted from the previous stage controller through the data line with the clock signal output from the change-over means.

2. The device as set forth in claim 1, wherein the clock generating circuit in the subsequent stage controller generates the data signal synchronized with the clock signal received from the previous stage controller through the clock signal line.

* * * * *